United States Patent [19]

Gerstner

[11] 4,164,747
[45] Aug. 14, 1979

[54] SEMICONDUCTOR ARRANGEMENT

[75] Inventor: Dieter Gerstner, Heilbronn, Fed. Rep. of Germany

[73] Assignee: Licentia Patent-Verwaltungs-G.m.b.H., Frankfurt, Fed. Rep. of Germany

[21] Appl. No.: 775,782

[22] Filed: Mar. 9, 1977

[30] Foreign Application Priority Data

Mar. 11, 1976 [DE] Fed. Rep. of Germany ....... 2610122

[51] Int. Cl.² ............................................. H01L 27/04
[52] U.S. Cl. ..................................... 357/46; 307/255; 307/315; 357/74
[58] Field of Search ..................... 357/46, 35, 40, 74; 307/315, 254, 300, 255, 299 R, 303

[56] References Cited

U.S. PATENT DOCUMENTS

| 2,862,171 | 11/1958 | Freeborn | 307/317 |
| 3,723,834 | 3/1973 | Peters | 357/74 X |
| 3,831,102 | 8/1974 | Medal | 307/300 X |
| 3,971,961 | 7/1976 | Inami et al. | 307/315 X |
| 3,995,307 | 11/1976 | Alcorn et al. | 307/315 X |

OTHER PUBLICATIONS

G.E. Transistor Manual, Seventh Edition, 1964, pp. 25-31.

Primary Examiner—James W. Davie
Attorney, Agent, or Firm—Spencer & Kaye

[57] ABSTRACT

A semiconductor arrangement for switching large currents comprises a drive transistor and an output transistor connected together in the manner of a Darlington circuit and being of the same region sequence, a further three region semiconductor component of opposite sequence being connected by its central region to the base of the drive transistor, by the outer region to the base of the output transistor and by its other outer region to an electrode of the output transistor which is not connected directly to the drive transistor.

9 Claims, 5 Drawing Figures

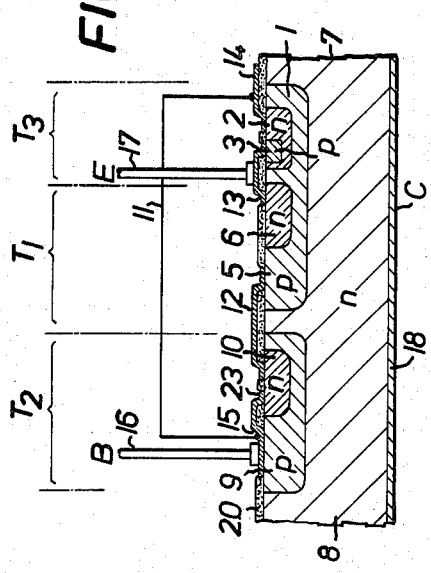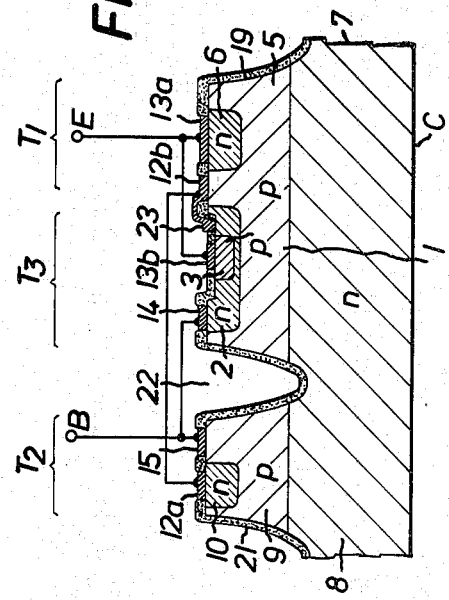

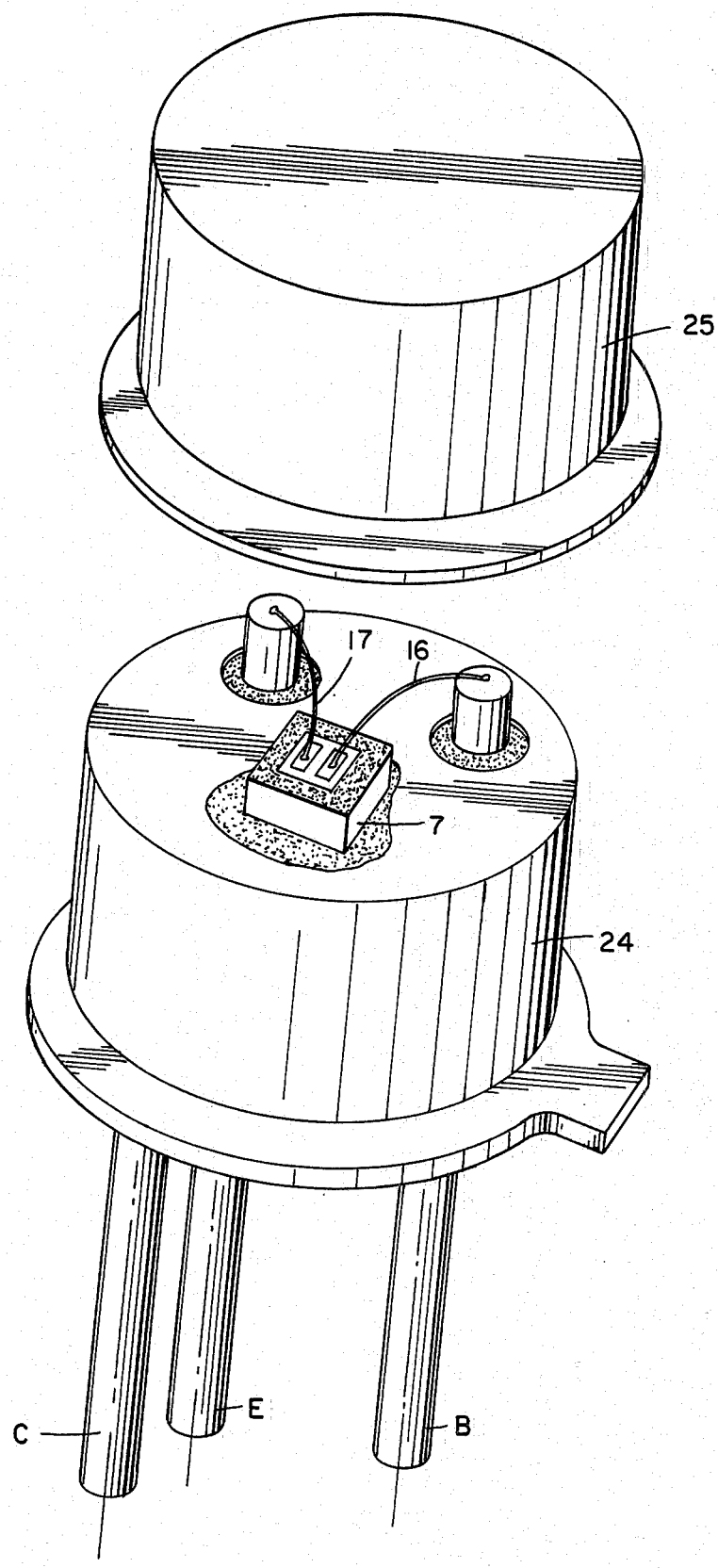

SEMICONDUCTOR ARRANGEMENT

BACKGROUND OF THE INVENTION

The invention relates to a triple pole semiconductor arrangement for switching large currents having two transistors of the same region sequence which are connected together like a Darlington circuit, one of these transistors acting as a driving transistor for the output transistor which switches the current.

In the Darlington circuit, the collectors of the two transistors are connected together while the emitter electrode of the driving transistor is connected to the base electrode of the output transistor. The compound circuit may be regarded as a single transistor whose amplification of current is approximately equal to the product of the current amplifications of the two individual transistors. This depends on the fact that the emitter current of the driving transistor is equal to the base current of the output power transistor. The Darlington circuit has the advantage that even large currents may be switched by small control currents so that the control currents required may be taken directly from a integrated switching circuit. In the Darlington circuit it is disadvantageous that the switching times are relatively long. Even when offering a large reverse current in the disconnection phase, with the Darlington transistor the switching time cannot be substantially reduced.

Furthermore the Darlington circuit has the disadvantage that at high temperatures it no longer operates as a switch in many cases. This is caused by the fact that at high temperatures the base current of the final transistor becomes so large that this output transistor constantly remains switched on.

SUMMARY OF THE INVENTION

It is an object of the invention to provide a triple pole semiconductor arrangement, such as that of the type described at the outset, which no longer has the stated disadvantages of the Darlington circuit. This should be realized by an arrangement which may also be handled as a single transistor like the Darlington circuit.

According to the invention, there is provided a three-pole semiconductor arrangement for switching large currents comprising a drive transistor, an output transistor of the same region sequence as said drive transistor and connected to said drive transistor in a manner similar to a Darlington circuit and a further semiconductor component having a three layer region sequence opposite to said drive and said output transistors with its central region connected to the base of said drive transistor, one outer region connected to the base of said output transistor and the other outer region connected to an electrode of said output transistor which is not connected directly to said drive transistor.

BRIEF DESCRIPTION OF THE DRAWINGS

The invention will now be described in greater detail, by way of example, with reference to the drawings, in which:

FIG. 1 shows the three-pole semiconductor arrangement in accordance with the invention in a schematic circuit construction;

FIG. 2 shows the $I_B/U_{BE}$ curve of the arrangement in accordance with the invention;

FIG. 3 shows one constructional embodiment of the circuit according to FIG. 1 in integrated semiconductor technology, and FIG. 4 shows a second constructional embodiment.

FIG. 5 shows the semiconductor arrangement according to the invention in a conventional transistor housing.

DESCRIPTION OF THE PREFERRED EMBODIMENTS

In a preferred embodiment of the invention, in a three-pole semiconductor arrangement in Darlington configuration, a further three-layer semiconductor component is provided having a zone sequence opposite to the Darlington transistors, its central region being connected to the base of the driving transistor, one external region being connected to the base of the output transistor and the second external region being connected to the electrode of the output transistor, said electrode not being connected directly to the driving transistor.

It has been proved that, in the three-pole semiconductor arrangement in accordance with the invention, the switch off times may be considerably reduced with respect to those of previously used Darlington transistor. Thus the switch off time in an embodiment could be reduced by a factor of two. Moreover, it was established that the high current flowing through the output transistor may also be safely switched off at high ambient temperatures when there is appropriate control at the base of the driving transistor. The output transistor always remains blocked in the disconnection phase and the additional three-layer semiconductor component prevents the output transistor from injection caused by the high reverse currents at high ambient temperatures.

The semiconductor arrangement in accordance with a preferred embodiment of the invention thus comprises three component parts which are selected so that the $I_B/U_{BE}$ curve of the entire component is approximately symmetrical to the zero point. The additional three-layer semiconductor component may be constructed for example as a lateral transistor. However it may also be a planar transistor of the usual type which may be driven normally or inversely.

During operation of the semiconductor arrangement, a control current is preferably impressed for the purpose of cutting off the output transistor, said control current corresponding approximately to the magnitude according to the impressed control current when the output transistor is switched on, but has reversed polarity. This control current only has to have a magnitude of approximately 1 to 5% of the desired output current when the output transistor is switched on so that normally the control current necessary may be supplied directly out of an integrated circuit.

Referring now to FIG. 1 of the drawings, the transistors $T_1$ and $T_2$ of the Darlington circuit comprise, for example, npn transistors. The collector of the output transistor $T_1$ is connected to the collector of the driving transistor $T_2$; the emitter of the driving transistor $T_2$ is in turn connected to the base of the output transistor $T_1$. The additional three-layer semiconductor component $T_3$ has a pnp layer sequence when the Darlington transistors have a npn region sequence. The central region 2 is connected to the base of the driving transistor $T_2$ while an outer region 1 is connected to the base of the output transistor $T_1$ and the other outer region 3 is connected to the emitter of the output transistor $T_1$.

The entire arrangement may be summarized again as a single transistor, its base, collector or emitter connection being designated in FIG. 1 by the letters B, C and E.

The input curve of a semiconductor arrangement according to FIG. 1 is shown in FIG. 2. The $I_B/U_{BE}$ curve is substantially symmetrical to the zero point, which means that even at relatively small negative base emitter voltages a remarkable negative base current already flows. According to polarity of the applied base emitter voltage the base current flows across the transistors $T_2$ and $T_1$ and in the other polarity across the additional transistor $T_3$.

FIG. 3 shows implementation of the circuit arrangement according to FIG. 1 in an integrated semi-conductor device. Two p-conductive regions 9 and 5 adjacent on another are diffused from one surface into a n-conductive semiconductor body 7, which forms the collector 8 for the transistors $T_1$ and $T_2$. Finally with the aid of the known masking, etching and diffusion technology a n-conductive region 10 is diffused into the p-conductive region 9 so that the first npn transistor $T_2$ is realized.

At the same time as diffusion of the n-conductive region 10, two n-conductive regions 6 and 2 are diffused into the p-conductive region 5 adjacent each other. The region 6 forms the emitter of the npn transistor $T_1$ while the region 2 produces the base region of the additional transistor $T_3$. In a last operation, a p-conductive region 3 must be diffused into the n-conductive region 2, which, together with the region 2 and the part 1 of region 5 located below the region 2, produces pnp transistor $T_3$.

Finally the individual regions of the semiconductor components are provided with metallic connecting contacts. Thus the collector contact 18 is arranged at the collector 8 of the transistors $T_1$ and $T_2$, while the region 9 has a contact 15, the regions 10 and 5 have a common contact 12, the regions 6 and 3 have a common contact 13 and the region 2 has the contact 14. The connecting contacts 15 and 14 are, moreover, connected together in order to implement the circuit according to FIG. 1 by means of a connecting wire 11 or by means of conductive path running on the semiconductor surface. The contact 15 is connected to the base connection 16, the contact 13 to the emitter connection 17 and the contact 18 to the collector connection for the entire arrangement. The insulating layer covering the pn junctions and the surface regions not required for the metal contacts is designated in FIG. 3 with the numeral 20.

FIG. 4 shows an embodiment similar to FIG. 3 which is suitable particularly for high voltage operation. A p-conductive semiconductor layer 19 is epitaxially formed on a n-conductive semiconductor body 7 which forms the collector region 8 for the transistors $T_1$ and $T_2$. A mesa-shaped edge formation is given to this semiconductor layer; moreover, a part of the mesa layer is separated off from the remaining part by means of a channel 22. The driving transistor $T_2$ is formed in this separated part, wherein the base region 9 is formed from the epitaxial layer, so that only the emitter region 10 must be manufactured by means of diffusion. The epitaxial layer even serves as a base region 5 for the output transistor $T_1$ into which base region, the emitter region 6 is formed by means of diffusion. In order to implement the additional transistor, a part of the n-conductive region 2 is preferably removed again by etching, this region 2 having been diffused into the epitaxial layer during manufacture of region 6. In this way it is possible for the doping of region 2 to be relatively small adjacent the surface, so that the p-conductive region 3 may be manufactured without difficulty by diffusing appropriate impurities. The regions 10, 9, 2, 3, 5 and 6 are provided, in the stated sequence, with contacts 12a, 15, 14, 13b, 12b, and 13a. In order to carry out the circuit according to FIG. 1, the contacts 12a and 12b as well as the contacts 13a and 13b must be connected together as are contacts 14 and 15. The collector body member 8 is in turn provided with a collector connection 18. The exposed parts of the semiconductor surfaces and the channel wall and the side surfaces of the mesa block are also provided with a passivation layer 21.

As shown in FIG. 5, the semiconductor body 7 with a circuit configuration according to the invention, for example as shown in FIG. 3 or 4, may be mounted in a conventional transistor housing including a header 24, with three terminals or connections, and a cap or cover 25 which fits over the header 24.

It has been proved that the three-pole semiconductor arrangement according to the invention is not damaged by positive and negative base currents. The control circuit may thus be so designed that it supplies a positive base current for the "on" condition and a negative base current for the "off" condition, without endangering the component. The required control currents are thus small; a value of 1% of the load current to be connected is typical. However even substantially high control currents, as may occur for example during faults, are not dangerous.

It has already been mentioned that the semiconductor arrangement in accordance with the invention has small blocking currents at high surrounding temperatures. Thus it has been found that the collector reverse current was only 10 $\mu$A when controlling a semiconductor arrangement in the "off" condition and a value $U_{CE}=100$ volts and a surrounding temperature of 120° C. In a Darlington circuit of conventional type the final transistor could no longer be kept in the off state at all under the stated conditions and remained undesirably in the "on" state. With a fairly small voltage of $U_{CE}=20$ volts the component in accordance with the invention exhibited a reverse current of only approximately 1 $\mu$A in an embodiment at 120° C., while the appropriate components from the transistors $T_1$ and $T_2$ had a return current of 50 to 100 $\mu$A. Thus it has been proved that, as a result of the arrangement in accordance with the invention, the stationary blocking characteristics could be considerably improved in comparison to a normal Darlington transistor.

A Schottky diode 23, which bridges the region sequence 2-1, may be provided at a suitable place in order to eliminate undesirable thyristor functioning via the layer sequence p-n-p-n, formed from the region 3-2-1-8, in the integrated arrangement shown.

This Schottky diode may be produced in a known manner by vapuir depositing a suitable metal, for example platinum, on the very pure n-silicon and may be covered subsequently in the usual manner by aluminium.

In the arrangement according to FIG. 3 the Schottky contact 23 was arranged at the n-region 10. As the n-region 10 is connected however to the p-region 5 or 1 and the p-region 9 to the n-region 2, the Schottky diode 23 acts as if it were connected directly between the regions 2-1.

It will be understood that the above description of the present invention is susceptible to various modification changes and adaptations.

What is claimed is:

1. A three-pole semiconductor arrangement for switching large currents having two transistors of the same region sequence connected together in a Darlington circuit, one of which acts as a driving transistor for the output transistor switching the current, characterized in that a further three-layer semiconductor transistor is provided with a region sequence opposite to that of the Darlington transistors, said further transistor having its central region directly connected to the base of said driving transistor, one outer region being connected to the base of the output transistor and its second outer region directly connected to the emitter of said output transistor.

2. A semiconductor arrangement as defined in claim 1, and comprising a housing in which the arrangement is positioned and which has three connections connected to the collector of said output transistor, said emitter of the output transistor and to said base of said driving transistor respectively with these connections forming the base, emitter or collector connections of the entire arrangement.

3. A semiconductor arrangement as defined in claim 1, wherein the individual components are so selected that the $I_B/U_{BE}$ curve of the entire arrangement is substantially symmetrical to the zero point.

4. A semiconductor arrangement as defined in claim 2, wherein said arrangement is an integrated structure including a semiconductor body having two transistors, constituting said driving and output transistors, formed therein with said two transistors having a common collector region and respective base and emitter regions; and said one outer region of said further three-layer semiconductor transistor is a part of the base region of said output transistor; wherein in order to form said central region, a further region of the conductivity type of the emitter region of said output transistor is introduced into the base region of said output transistor; and that finally the said second outer region of said three-layer transistor is introduced into said further region of the conductivity type of the emitter region.

5. A semiconductor arrangement as defined in claim 4, wherein said emitter region of said output transistor and said central region of said further transistor are manufactured in a single diffusion process.

6. A semiconductor arrangement as defined in claim 1 used with an impressed control current for cutting off said output transistor which corresponds approximately to the magnitude of the impressed control current when said output transistor is switched on but which has the reverse polarity.

7. A semiconductor arrangement as defined in claim 6, wherein said control current amounts to approximately 1 to 5% of the desired output current when said output transistor is switched on.

8. A semiconductor arrangement for switching large currents comprising a drive transistor, an output transistor of the same region sequence as said drive transistor and connected to said drive transistor in a Darlington circuit so that the emitter of said drive transistor is connected to the base of said output transistor and the collectors of said drive and output transistors are connected together, and a further transistor having a three-layer region sequence opposite to said drive and said output transistors, said further transistor having its central region directly connected to the base of said drive transistor, one outer region connected to the base of said output transistor and its other outer region directly connected to the emitter of said output transistor.

9. A semiconductor circuit arrangement as defined in claim 8 wherein said arrangement is an integrated circuit including a semiconductor body having: a first region of a first conductivity type and constituting the common collector region of said drive transistor and said output transistor; second and third spaced regions of the opposite conductivity type forming respective pn junctions with said first region and constituting the base regions of said drive and output transistors respectively; fourth and fifth regions of said first conductivity type formed within said second and third regions respectively and constituting the emitter regions of said drive, and output transistors respectively; a sixth region of said first conductivity type, and constituting said central region, formed in said third region; and a seventh region of said opposite conductivity type formed in said sixth region and constituting said second outer region of said further transistor, said one outer region being formed by a portion of said third region.

* * * * *